(12) United States Patent
Haraguchi (10) Patent No.: US 10,531,018 B2
(45) Date of Patent: Jan. 7, 2020

(54) IMAGE SENSOR FOR SUPPRESSING READOUT TIME OF IMAGE SIGNAL AND FOCUS DETECTION SIGNAL, CONTROL METHOD THEREFOR, AND IMAGE CAPTURING APPARATUS

(71) Applicant: CANON KABUSHIKI KAISHA, Tokyo (JP)

(72) Inventor: Kazuki Haraguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 15/895,590

(22) Filed: Feb. 13, 2018

(65) Prior Publication Data
US 2018/0241952 A1 Aug. 23, 2018

(30) Foreign Application Priority Data

Feb. 21, 2017 (JP) .................................. 2017-030247

(51) Int. Cl.
| H04N 5/335 | (2011.01) |
| H04N 5/232 | (2006.01) |
| H01L 27/146 | (2006.01) |
| H04N 5/341 | (2011.01) |
| H04N 5/3745 | (2011.01) |
| H04N 5/378 | (2011.01) |

(52) U.S. Cl.
CPC ....... *H04N 5/335* (2013.01); *H01L 27/14609* (2013.01); *H01L 27/14627* (2013.01); *H01L 27/14641* (2013.01); *H04N 5/23212* (2013.01); *H04N 5/341* (2013.01); *H04N 5/378* (2013.01); *H04N 5/37457* (2013.01)

(58) Field of Classification Search
CPC .... H04N 5/335; H04N 5/23212; H04N 5/341; H04N 5/37457; H04N 5/378; H01L 27/14609; H01L 27/14627; H01L 27/14641
See application file for complete search history.

(56) References Cited

U.S. PATENT DOCUMENTS

| 2015/0215561 A1* | 7/2015 | Maehashi | H04N 5/3745 348/273 |
| 2017/0201702 A1* | 7/2017 | Niwa | H01L 27/14612 |
| 2019/0028661 A1* | 1/2019 | Nikai | H04N 5/341 |

FOREIGN PATENT DOCUMENTS

| JP | 2001-124984 A | 5/2001 |
| JP | 2016-021052 A | 2/2016 |

* cited by examiner

*Primary Examiner* — Nicholas G Giles
(74) *Attorney, Agent, or Firm* — Cowan, Liebowitz & Latman, P.C.

(57) ABSTRACT

An image sensor comprises: a pixel array having a plurality of photoelectric conversion portions provided for each of a plurality of microlenses arranged in matrix; a plurality of signal output lines provided for each column of the pixel array; signal readout circuits each provided for each column of the pixel array; and a control circuit that controls to output a signal of a selected row to one of the plurality of signal output lines and controls to process the signal by the corresponding signal readout circuit. The control circuit performs control such that while a signal of a first row output to one of the plurality of signal output lines is processed by the corresponding signal readout circuit, a signal from a second row is output to another of the plurality of signal output lines.

9 Claims, 9 Drawing Sheets

IMAGE SENSOR FOR SUPPRESSING READOUT TIME OF IMAGE SIGNAL AND FOCUS DETECTION SIGNAL, CONTROL METHOD THEREFOR, AND IMAGE CAPTURING APPARATUS

BACKGROUND OF THE INVENTION

Field of the invention

The present invention relates to an image sensor, a control method therefor, and an image capturing apparatus, and more specifically to an art of circuit configuring an image sensor.

Description of the Related Art

In recent years, in image capturing apparatuses using image sensors such as CMOS sensors, multifunctionality has progressed, and not only generation of captured images such as still images/moving images, but also control of image capturing apparatuses such as focus adjustment, for example, are performed based on information obtained from the image sensors.

For example, Japanese Patent Laid-Open No. 2001-124984 discloses a technique capable of performing focus detection using a pupil division method by using signals obtained from an image sensor. In Japanese Patent Laid-Open No. 2001-124984, by providing one microlens (ML) and two photodiodes (PD) for each pixel of the image sensor, respective PDs capture light passing through different pupil regions of the imaging lens. By comparing output signals from the two PDs of each pixel, focus detection becomes possible, and it is also possible to generate a captured image by adding the output signals from the two PDs for each pixel.

In addition, Japanese Patent Laid-Open No. 2016-21052 discloses a technique of acquiring signals for focus detection only from a part of rows in a screen.

However, in the conventional technique disclosed in the above-mentioned Japanese Patent Laid-Open No. 2001-124984, since it is necessary to read a focus detection signal in addition to an image signal, the readout time increases.

Further, in the technique disclosed in Japanese Patent Laid-Open No. 2016-21052, an increase in the readout time is suppressed by reading the focus detection signal only from a part of the rows in the screen. However, the readout time differs between in a row from which only the image signal is read out and in a row from which both the image signal and focus detection signals are read out. Consider, for example, a case where a subject moving at a high speed is captured by the rolling shutter driving method disclosed in Japanese Patent Laid-Open No. 2016-21052. In this case, in addition to the conventionally known rolling distortion phenomenon, distortion also occurs between the rows from which only the image signal is read out and the rows from which the image pickup signal and the focus detection signals are read out, and there is concern about giving the user a feeling of discomfort.

SUMMARY OF THE INVENTION

The present invention has been made in consideration of the above situation, and suppresses an increase in readout time for obtaining an image signal and focus detection signals.

According to the present invention, provided is an image sensor comprising: a pixel array having a plurality of photoelectric conversion portions provided for each of a plurality of microlenses arranged in matrix; a plurality of signal output lines provided for each column of the pixel array; signal readout circuits each provided for each column of the pixel array; and a control circuit that controls to output a signal of a selected row to one of the plurality of signal output lines and controls to process the signal by the corresponding signal readout circuit, wherein the control circuit performs control such that while a signal of a first row output to one of the plurality of signal output lines is processed by the corresponding signal readout circuit, a signal from a second row, different from the first row, is output to another of the plurality of signal output lines.

Further, according to the present invention, provided is an image capturing apparatus including: an image sensor comprising: a pixel array having a plurality of photoelectric conversion portions provided for each of a plurality of micro lenses arranged in matrix; a plurality of signal output lines provided for each column of the pixel array; signal readout circuits each provided for each column of the pixel array; and a control circuit that controls to output a signal of a selected row to one of the plurality of signal output lines and controls to process the signal by the corresponding signal readout circuit, and a processor that processes a signal output from the image sensor, wherein the control circuit performs control such that while a signal of a first row output to one of the plurality of signal output lines is processed by the corresponding signal readout circuit, a signal from a second row, different from the first row, is output to another of the plurality of signal output lines.

Furthermore, according to the present invention, provided is a control method of an image sensor that has a pixel array having a plurality of photoelectric conversion portions provided for each of a plurality of microlenses arranged in matrix, a plurality of signal output lines provided for each column of the pixel array, and signal readout circuits each provided for each column of the pixel array, the method comprising: processing, while outputting a signal from a first row to one of the plurality of signal output lines, a signal output from a row different from the first row to another of the plurality of signal output lines by the corresponding signal readout circuit; and outputting, while processing the signal output from the first row to the one of the plurality of signal output lines by the corresponding signal readout circuit, a signal output from a row different from the first row to another of the plurality of signal output lines.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

Figure 1:
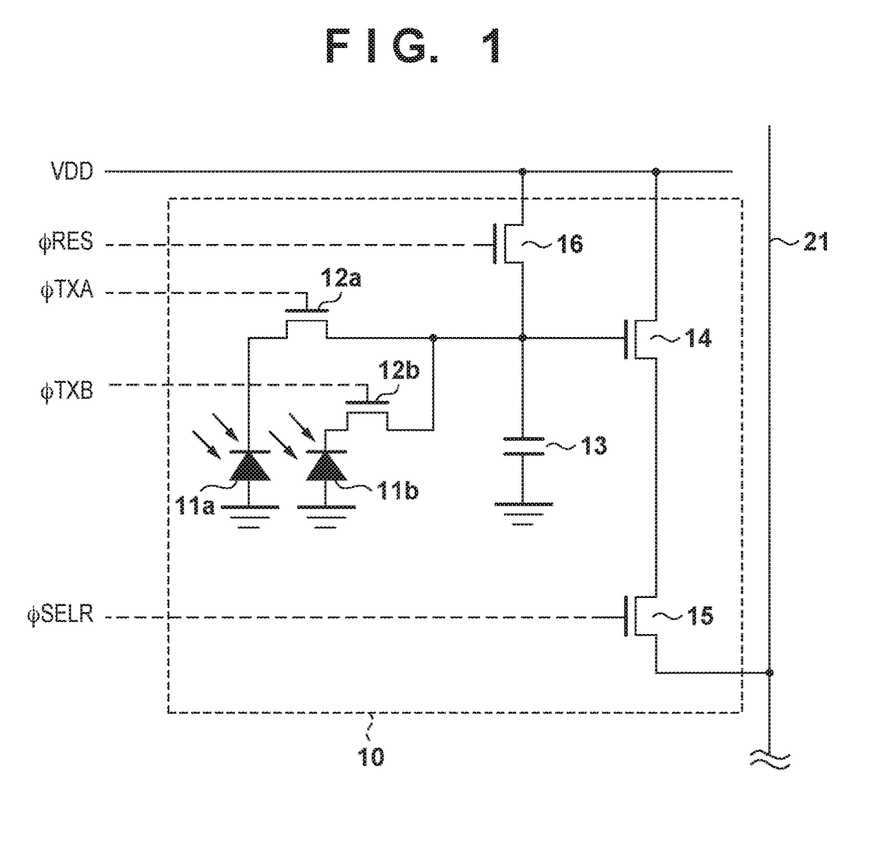
FIG. 1 is an equivalent circuit diagram showing a configuration of a unit pixel according to a first embodiment of the present invention.

FIG. 1 is a diagram showing a circuit configuration of a unit pixel 10 according to an embodiment. Each unit pixel 10 is formed for each of a plurality of microlenses (ML), not shown, which are arranged in a matrix. The unit pixel 10 has photodiodes (PD) 11a and 11b (photoelectric conversion portions), transfer switches 12a and 12b, a floating diffusion portion (PD) 13, an amplification MOS amplifier 14, a row selection switch 15, and a reset switch 16.

The PDs "11a and 11b are formed under one microlens, and generate electric charges corresponding to light incident through different pupil regions of an imaging optical system that will be described later. The transfer switches 12a and 12b are driven by transfer pulses φTXA and φTXB input to their gate terminals, and transfer the charge generated at the PD 11a and PD 11b to the FD 13. In a case where only the transfer switch 12a (or 12b) is controlled, a signal can be read out only from the PD 11a (or 11b). Further, in a case where both of the transfer switches 12a and 12b are simultaneously controlled, the charge generated at the PD 11a and PD 11b are added in the FD 13, and thereby it is possible to read out an added signal of the PD 11a and PD 11b. Hereinafter, an image obtained from the signal read out from the PD 11a is referred to as an A image, an image obtained from the signal read out from the PD 11b is referred to as a B image, and an image obtained from an added signal read out from PD 11a and PD 11b is referred to as an A+B image.

The FD 13 functions as a charge voltage converting unit that temporarily accumulates the charge and converts the accumulated charge into a voltage signal. The amplification MOS amplifier 14 functions as a source follower together with constant current circuits 22a and 22b to be described later, and a signal that has undergone charge-voltage conversion by the FD 13 is input to the gate thereof.

The row selection switch 15 is driven by a row selection pulse φSELR input to its gate, its drain is connected to the amplification MOS amplifier 14, and its source is connected to a vertical output line 21 (signal output line) to be described later. The row selection switch 15 provided with the row selection pulse φSELR of a high level enters a conducting state, and the source of the amplification MOS amplifier 14 corresponding thereto is connected to the vertical output line 21.

The reset switch 16 has its drain connected to the power supply line VDD and is driven by a reset pulse φRES input to its gate to remove the charge accumulated in the FD 13. Also, by turning ON the reset switch 16 and the transfer switches 12a and 12b at the same time, the PDs 11a and 11b can be reset. It should be noted that the amplification MOS amplifier 14 outputs a reset signal to the vertical output line 21 when the FD 13 is reset by the reset pulse φRES. In addition, when the charge generated in the PDs 11a and 11b is transferred by the transfer pulses φTXA and φTXB, a transferred signal including a signal obtained by the photoelectric conversion of the PDs 11a and 11b is output.

Figure 2:
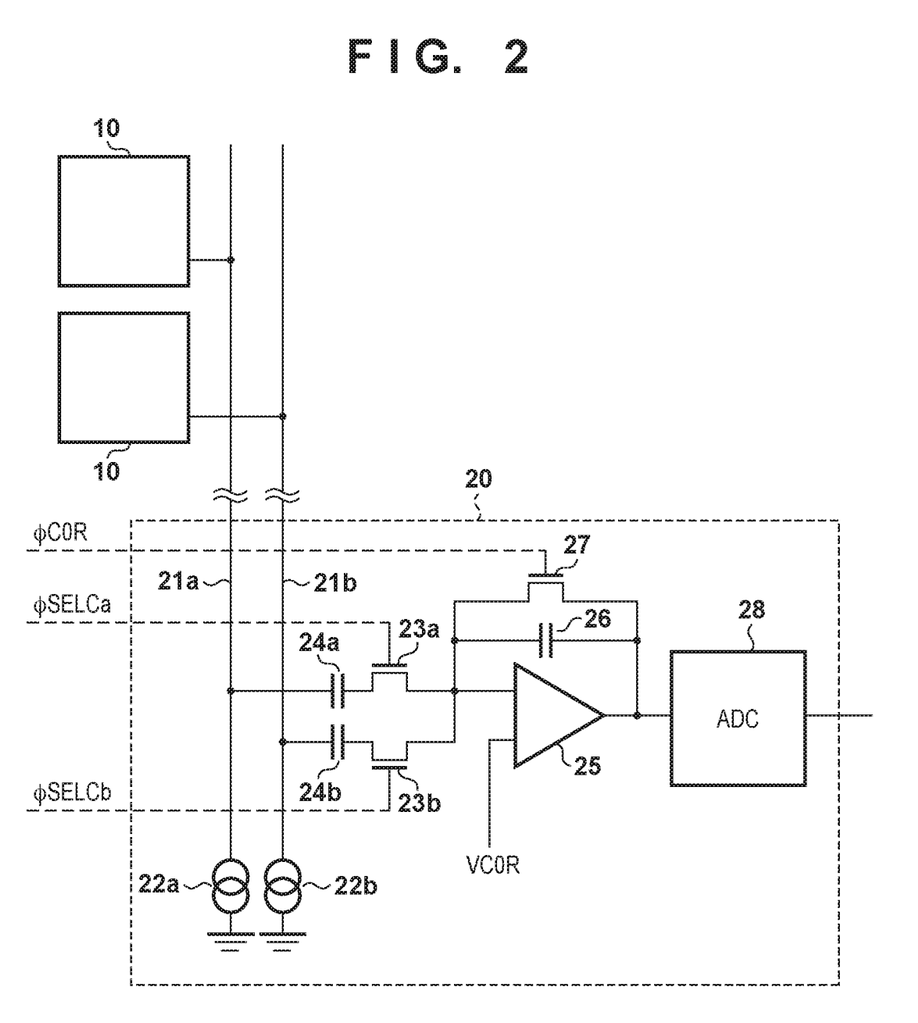
FIG. 2 is an equivalent circuit diagram showing a configuration of a signal readout circuit according to the first embodiment.

FIG. 2 shows the configuration of a signal readout circuit 20 according to this embodiment. The signal readout circuit 20 is configured with two vertical output lines 21a and 21b and one signal readout circuit per unit pixel. To the signal readout circuit 20, the signals of the two vertical output lines 21a and 21b are input. The constant current circuits 22a and 22b are connected to the two vertical output lines 21a and 21b, respectively, and function as source follower circuits together with the amplification MOS amplifier 14. At this time, the potential of a signal in the FD 13 is reflected in the potential of the vertical output line 21a or 21b.

The signal readout circuit 20 includes two input changeover switches 23a and 23b, two clamp capacitors 24a and 24b, a differential amplifier 25, a gain capacitor 26, a clamp switch 27, and an AD conversion circuit (ADC) 28. The two clamp capacitors 24a and 24b are connected to corresponding vertical output lines 21a and 21b, respectively.

The input changeover switches 23a and 23b are driven by vertical output line switching pulses φSELCa and φSELCb input to the respective gates to switch connection/disconnection between the differential amplifier 25 and the clamp capacitors 24a and 24b. As a result, the clamp capacitors 24a and 24b can be selectively connected to the differential amplifier 25. The differential amplifier 25, the clamp capacitors 24a and 24b, and the gain capacitor 26 operate as analog gain amplifiers by being connected as shown in the figure, and output analog signals to the AD conversion circuit 28.

The clamp switch 27 is driven by a clamp pulse φC0R input to its gate to short between the output terminal and one of the input terminals of the differential amplifier 25. A reference voltage VC0R is input to the other input terminal of the differential amplifier 25, and when the clamp switch 27 becomes an active level (high level), the output terminal and the input terminal of the differential amplifier 25 are reset to the reference voltage VC0R.

The AD conversion circuit 28 is connected to the output terminal of the differential amplifier 25, and converts the analog signal outputted from the differential amplifier 25 into a digital signal and outputs it. In this embodiment, the circuit that operates as an analog gain amplifier is provided upstream of the AD conversion circuit 28. However, this circuit may be omitted and the vertical output lines 21a and 21b and the AD conversion circuit 28 may be connected via the input changeover switches 23a and 23b.

In the above description, only one unit pixel and one signal readout circuit are described, however, unit pixels are actually arranged by rows and columns in a matrix, and the signal readout circuit 20 is configured for each column of unit pixels.

Figure 3:
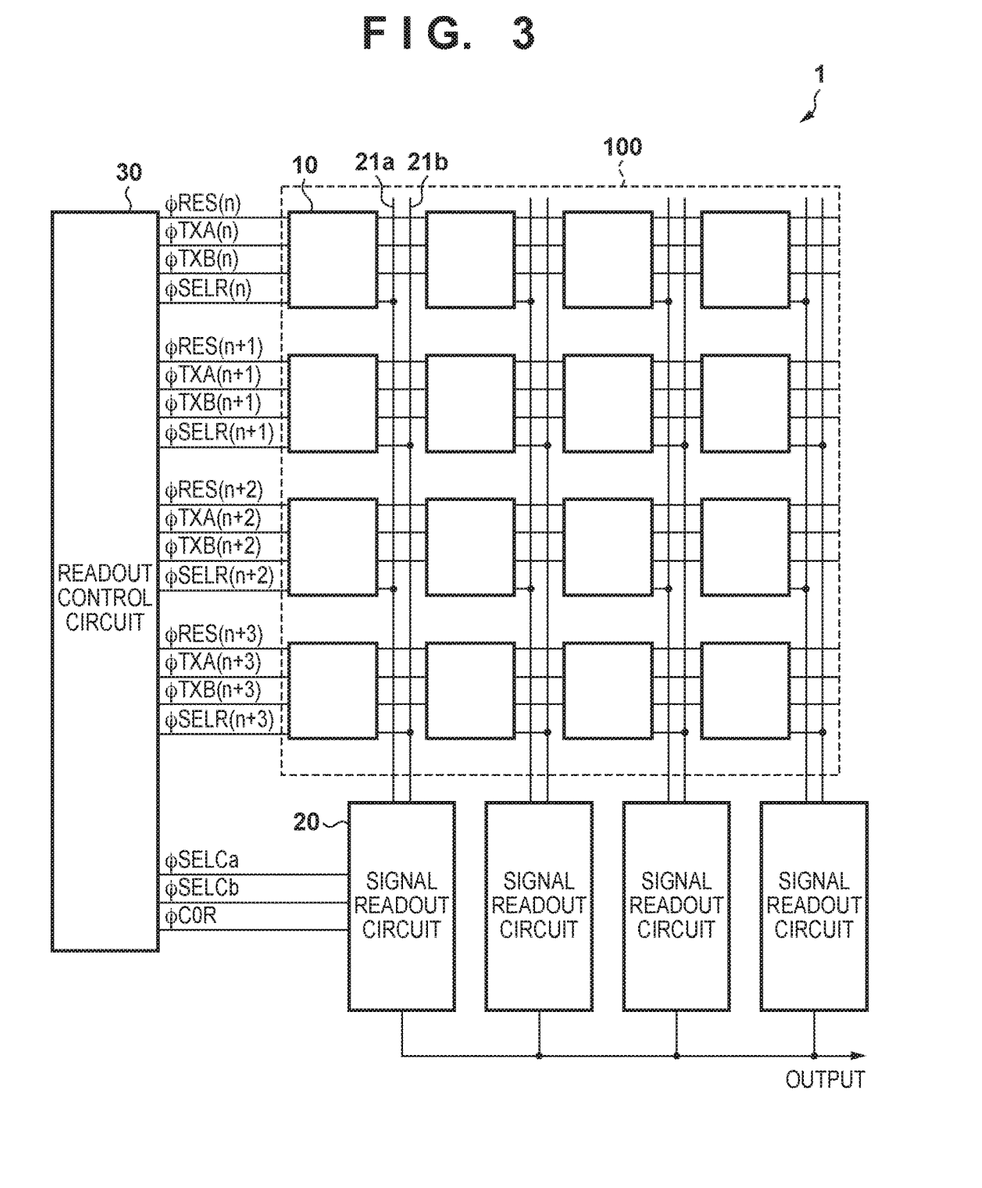
FIG. 3 is a block diagram showing a configuration of part of an image sensor according to the first embodiment.

FIG. 3 is a block diagram showing a configuration of part of an image sensor 1 in this embodiment. The image sensor 1 includes a pixel array 100 in which the unit pixels 10 shown in FIG. 1 are arranged in a matrix, a plurality of signal readout circuits 20 each provided for each column of the pixel array 100, and a readout control circuit 30 for controlling signal readout on a row-by-row basis. In the example shown in FIG. 3, the unit pixels 10 located in the odd rows are connected to the vertical output lines 21a, and the unit pixels 10 located in the even rows are connected to the vertical output lines 21b. In FIG. 3, the unit pixels 10 for 4 rows and 4 columns are shown as the pixel array 100, but normally the pixel array 100 is composed of hundreds of thousands to tens of millions of the unit pixels 10.

The readout control circuit 30 supplies the row selection pulse φSELR, the reset pulse φRES, and the transfer pulses ϕTXA and ϕTXB to one of the unit pixel rows to control the signal output operation to the vertical output lines 21a and 21b. In addition, the readout control circuit 30 supplies the vertical output line switching pulses ϕSELCa and ϕSELCb and the clamp pulse ϕC0R to the signal readout circuits 20 to control the signal readout operation of the vertical output lines 21a and 21b. In the description of FIG. 3 and the subsequent description, the "reset pulse ϕRES for the n-th row" is referred to as "reset pulse ϕRES(n)" with the suffix n. This also applies to the transfer pulses ϕTXA and ϕTXB and the row selection pulse ϕSELR.

Also, in this embodiment, a configuration in which the signal readout circuit 20 is shared by pixel units 10 in each column of the pixel array 100 is explained, but the gist of the present invention is not limited thereto, and various configurations can be adopted. For example, in a stacked type image sensor having a first substrate and a second substrate connected via a bump junction or the like, the pixel array 100 is provided on the first substrate, and a plurality of the signal readout circuits 20 may be arranged on the second substrate so that each signal readout circuit 20 is provided for each unit pixel 10 or for each group of unit pixels 10.

<First Embodiment>

Figure 4:
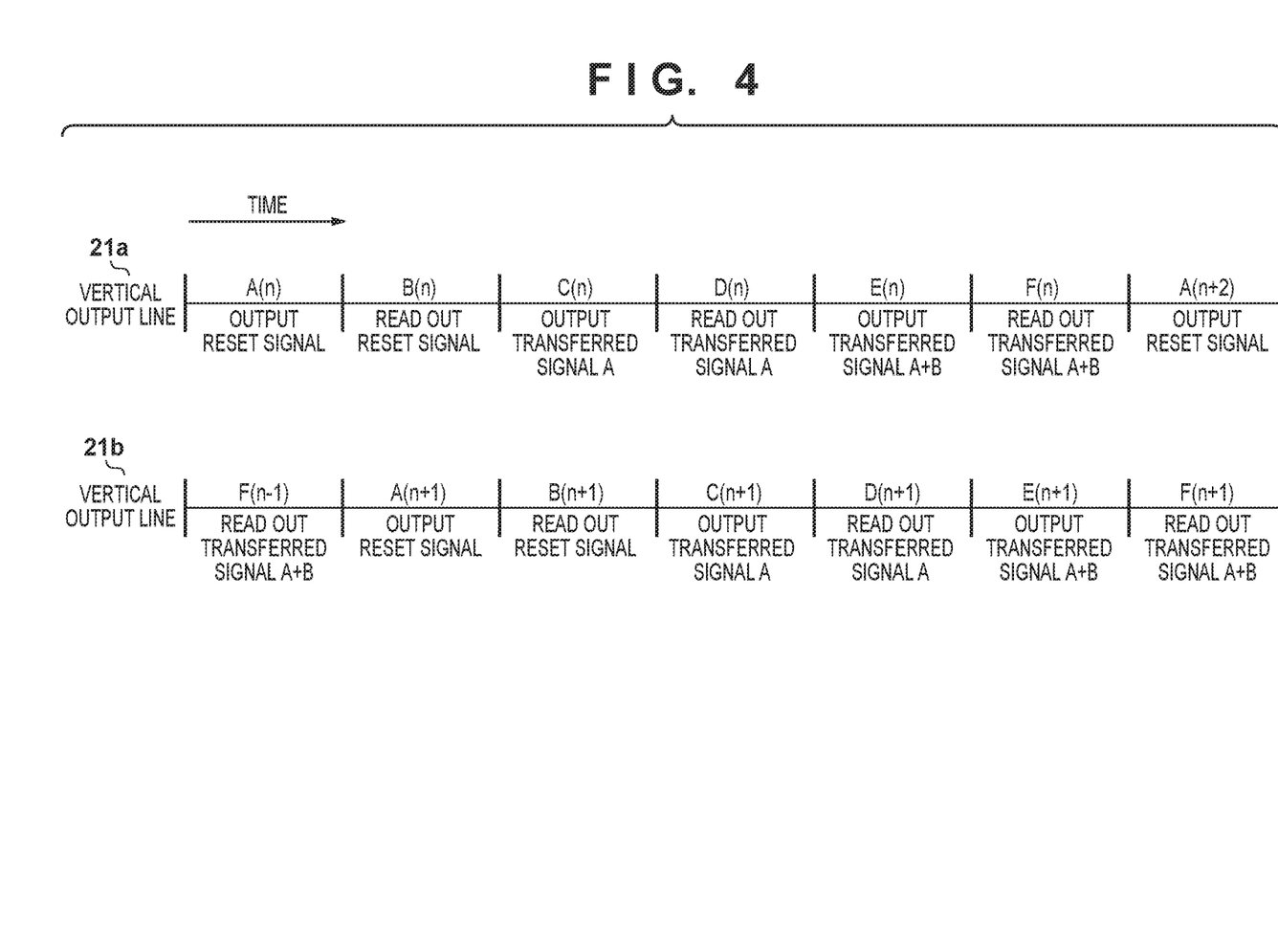
FIG. 4 is a diagram for explaining an outline of a signal readout operation according to the first embodiment.

Hereinafter, a driving method for reading out the focus detection signals at high speed in addition to the image signal according to a first embodiment of the present invention will be described. Before explaining in detail the operation of reading out the signal of the unit pixel 10, the outline of the operation in the first embodiment will be described. FIG. 4 is a diagram schematically showing a flow of a signal output operation executed by the unit pixel 10 and a signal readout operation executed by the signal readout circuit 20 under control of the readout control circuit 30. Reading out of the signal of the unit pixel 10 is broadly divided into the following six operations A to F.

Operation A: The readout control circuit 30 turns on the reset switch 16 of the unit pixel 10 and causes a signal output operation to be executed, wherein the signal output operation is to output a reset signal to either of the vertical output lines 21a and 21b to which the unit pixel 10 is connected. Then waiting for the reset signal outputted to one of the vertical output lines 21a and 21b to settle is performed.

Operation B: The readout control circuit 30 causes the signal readout circuit 20 to execute a signal readout operation, wherein the signal readout operation is to read out the reset signal output to one of the vertical output lines 21a and 21b to the signal readout circuit 20.

Operation C: The readout control circuit 30 turns on the transfer switch 12a or 12b of the unit pixel 10 to output a transferred signal from the PD 11a or the PD 11b to the FD 13, and causes a signal output operation to be executed, wherein the signal output operation is to output the signal held in the FD 13 to either of the vertical output lines 21a and 21b to which the unit pixel 10 is connected. Then, waiting for the transferred signal output to one of the vertical output lines 21a and 21b to settle is performed. In the first embodiment, it is assumed that the transfer switch 12a is turned on, and a transferred signal A from the PD 11a is output to one of the vertical output lines 21a and 21b.

Operation D: The readout control circuit 30 causes the signal readout circuit 20 to execute a signal readout operation, wherein the signal readout operation is to read out the transferred signal A output to one of the vertical output lines 21a and 21b via the signal readout circuit 20.

Operation E: The readout control circuit 30 turns on the transfer switch 12a or 12b of the unit pixel 10 which was not turned on in the operation C to output a transferred signal A+B from the PD 11a and the PD 11b in the FD 13, and causes a signal output operation to be executed, wherein the signal output operation is to output the signal A+B held in the FD 13 to either of the vertical output lines 21a and 21b to which the unit pixel 10 is connected. Then, waiting for the transferred signal A+B output to one of the vertical output lines 21a and 21b to settle is performed.

Operation F: The readout control circuit 30 causes the signal readout circuit 20 to execute a signal readout operation, wherein the signal readout operation is to read out the transferred signal A+B output to one of the vertical output lines 21a and 21b via the signal readout circuit 20.

The readout control circuit 30 executes the operation A(n) for the n-th row and outputs a reset signal to the vertical output line 21a. At this time, as will be described in detail later, the operation F(n−1) is executed for the (n−1)-th row. In the operation A(n), the vertical output line 21a is used, however, the signal readout circuit 20 is not used. Accordingly, in the first embodiment, while performing the operation A(n), the operation F is performed for another unit pixel row using the other vertical output line 21b.

Next, the readout control circuit 30 executes the operation B(n) by controlling the signal readout circuit 20, and the reset signal output to the vertical output line 21a is read out to the signal readout circuit 20. In addition, the readout control circuit 30 executes the operation A(n+1) for the (n+1)-th row. In other words, the readout control circuit 30 executes the operation B(n) of reading out the reset signal output from the unit pixels 10 in the n-th row and the operation A(n+1) of outputting the reset signal output from the unit pixels 10 in the (n+1)-th row to the vertical output line 21b in parallel.

Next, the readout control circuit 30 controls the signal readout circuit 20 to execute the operation B(n+1) of reading out the reset signal of the (n+1)-th row, thereby reading out the reset signal output to the vertical output line 21b to the signal readout circuit 20. In this way, after the operation B(n) of reading out the reset signal of the n-th row is completed, the operation B(n+1) of reading out the reset signal output to the vertical output line 21b can be immediately performed without waiting for time required for performing the operation A(n+1) of outputting the reset signal of the (n+1)-th row. As a result, it is possible to increase the readout speed.

in the operation B(n+1) of reading out the reset signal of the (n+1)-th row to the signal readout circuit 20, the vertical output line 21b and the signal readout circuit 20 is used, but the vertical output line 21a is not used. Accordingly, in the first embodiment, while performing the operation B (n+1), the operation C(n) is performed for the n-th row using the other vertical output line 21a, and the transferred signal A from the PDs 11a in the n-th row is output to the vertical output line 21a.

Thereafter, similarly to the above operation, the readout control circuit 30 controls to concurrently read out the signals from the unit pixels 10 in the n-th row and the signals from the unit pixels 10 in the (n+1)-th row using the two vertical output lines 21a and 21b. Namely, the readout control circuit 30 controls to concurrently execute the operation D(n) for the n-th row and the operation C(n+1) for the (n+1)-th row, then, to concurrently execute the operation E(n) for the n-th row and the operation D(n+1) for the (n+1)-th row. Furthermore, the readout control circuit 30 controls to concurrently execute the operation F(n) for the n-th row and the operation E(n+1) for the (n+1)-th row.

After the operation F(n) for the n-th row is finished, then the operation A(n+2) for the (n+2)-th row and the operation F(n+1) for the (n+1)-th row is are performed. Then, similarly to the above operation, signals are read out from the unit pixels 10 of all of the pixel array 100 by 2 rows.

Since it becomes possible to perform the operations A, C and E in which the vertical output line 21a or 21b settle in parallel with the operations B, D and F that use the signal readout circuit 20, as explained above, it is possible to increase the readout speed.

It should be noted that, in the above example, the case where the operation B(n) for the n-th row and the operation A(n+1) for the (n+1)-th row are performed in parallel has been described. However, the present invention is not limited thereto, and readout of a signal that has been output to the vertical output line 21b for the (n+1)-th line to the signal readout circuit 20 needs to be performed while reading out a signal from the unit pixels 10 in the nth row to the vertical output line 21a. For example, control may be made to perform the operation B(n) and the operation C(n+1) in parallel.

With the operation above, it is possible to obtain the A image and the A+B image. The A+B image is used as a captured image, and it is possible to perform a focus detection by generating a B image by subtracting the A image from the A+B image, and comparing the A image and the B image.

Figure 5:
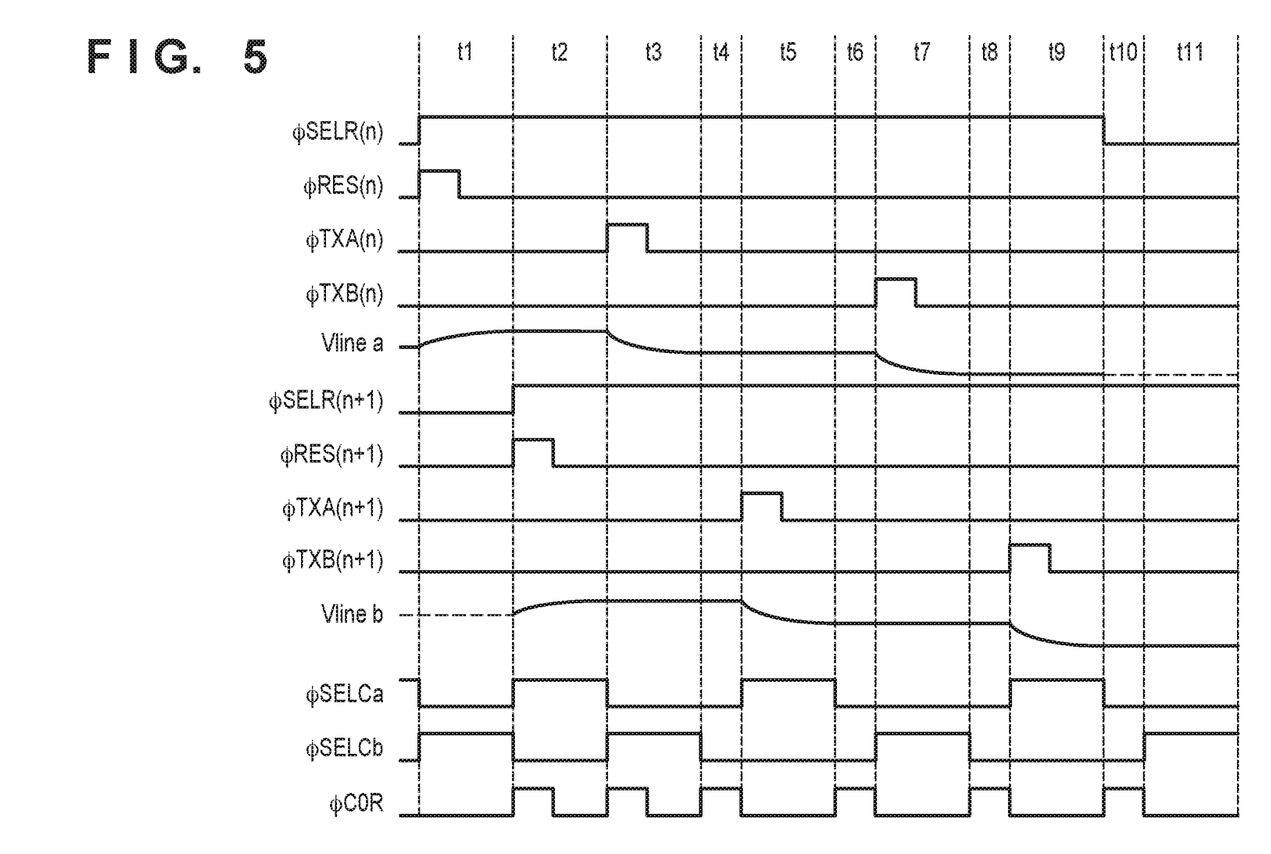
FIG. 5 is a timing chart showing the signal readout operation according to the first embodiment.

Next, a specific operation performed by the readout control circuit 30 in the first embodiment will be described in detail using a timing chart. FIG. 5 is a timing chart showing the signal output operation and the signal readout operation performed by the readout control circuit 30 in the first embodiment. In this timing chart, control pulses, "Vline a" that indicates the potential of the vertical output line 21a, and "Vline b" that indicates the potential of the vertical output line 21b are illustrated. In the following explanation, the pulse level that turns on each switch is expressed as a high level "H", and the pulse level that turns off each switch is expressed as a low level "L".

In a period t1, the row selection pulse ϕSELR(n) becomes "H", and the unit pixel 10 in the n-th row starts outputting a signal to the corresponding vertical output line 21a. At the same time, the reset pulse ϕRES(n) becomes "H" to eliminate the unnecessary charge of the FDs 13 in the nth row, and it becomes "L" after resetting the potential of the FDs 13. At this time, the unit pixels 10 in the n-th row outputs a reset signal to the vertical output line 21a. The reset signal is reflected on the vertical output line 21a over the settling time as indicated by Vline a (operation A(n)).

In a period t2, the vertical output line switching pulse ϕSELCa becomes "H" and the vertical output line switching pulse ϕSELCb becomes "L", thereby the differential amplifier 25 is connected to the vertical output line 21a via the clamp capacitor 24a. At this time, the signal readout circuit 20 reads out the reset signal from the vertical output line 21a. At the same time, the clamp pulse ϕC0R becomes "H", and the input terminal and the output terminal of the differential amplifier 25 are reset to the reference voltage VC0R. Thereafter, the clamp pulse ϕC0R becomes "L", and the clamp capacitor 24a clamps (holds) the reset signal of the n-th row to the reference voltage VC0R (Operation B(n)). Further, in the same period t2, the row selection pulse ϕSELR(n+1) becomes "H", and each of the unit pixels 10 in the (n+1)-th row starts outputting a signal to the corresponding vertical output line 21b. At the same time, the reset pulse ϕRES(n+1) becomes "H" to eliminate the unnecessary charging of the FDs 13 in the (n+1)-th row, and it becomes "L" after resetting the potential of the FDs 13. At this time, the unit pixels 10 in the (n+1)-th row output the reset signal to the vertical output line 21b. The reset signal is reflected on the vertical output line 21b over the settling time as indicated by Vline b (operation A(n+1)).

In a period t3, the vertical output line switching pulse ϕSELCa becomes "L" and the vertical output line switching pulse ϕSELCb becomes "H", so that the clamp capacitor 24a is disconnected from the differential amplifier 25, and the clamp capacitor 24b is connected instead. At this time, the signal readout circuit 20 reads out the reset signal from the vertical output line 21b. The clamp pulse ϕC0R is "H", and the input terminal and the output terminal of the differential amplifier 25 are reset to the reference voltage VC0R. Thereafter, when the clamp pulse ϕC0R becomes "L", the clamp capacitor 24b clamps (holds) the reset signal of the (n+1)-th row to the reference voltage VC0R (operation B(n+1)). Further, in the same period t3, the transfer pulse ϕTXA(n) becomes "H", and the charge accumulated in the PDs 11a in the n-th row is transferred to the FDs 13. Thereafter, the transfer pulse ϕTXA(n) becomes "L", and each of the unit pixels 10 in the n-th row outputs the transferred signal to the corresponding vertical output line 21a. The transferred signal A is reflected on the vertical output line 21a over the settling time (operation C(n)).

In a period t4, the vertical output line switching pulse ϕSELCb becomes "L", and the clamp capacitor 24b is disconnected from the differential amplifier 25. Further, the clamp pulse ϕC0R becomes "H" and the input terminal and the output terminal of the differential amplifier 25 are reset to the reference voltage VC0R.

In a period t5, the clamp pulse ϕC0R becomes "L" and the vertical output line switching pulse ϕSELCa becomes "H", and the clamp capacitor 24a is connected to the differential amplifier 25. As a result, the signal readout circuit 20 reads the transferred signal A of the n-th row from the settled vertical output line 21a. The differential amplifier 25 performs signal amplification according to the signal gain determined by the capacitance ratio of the clamp capacitor 24 and the gain capacitor 26, and outputs the result to the AD conversion circuit 28. Strictly speaking, since the reset signal is clamped to the reference voltage VC0R by the clamp capacitor 24, the difference between the reset signal and the transferred signal A is amplified. The AD conversion circuit 28 converts the signal input from the differential amplifier 25 into a digital signal and outputs it to outside of the image sensor 1 (operation D(n)). Further, in the same period t5, the transfer pulse ϕTXA(n+1) becomes "H", and the charge accumulated in the PDs 11a in the (n+1)-th row is transferred to the FDs 13. Thereafter, the transfer pulse ϕTXA(n+1) becomes "L", and each of the unit pixels 10 in the (n+1)-th row outputs the transferred signal A to the vertical output line 21b. The transferred signal A is reflected on the vertical output line 21b over the settling time (operation C(n+1)).

In a period t6, the vertical output line switching pulse ϕSELCa becomes "L", and the clamp capacitor 24a is disconnected from the differential amplifier 25. Further, the clamp pulse ϕC0R becomes "H" and the input terminal and the output terminal of the differential amplifier 25 are reset to the reference voltage VC0R.

In a period t7, the clamp pulse φC0R becomes "L" and the vertical output line switching pulse φSELCb becomes "H", and the clamp capacitor 24b is connected to the differential amplifier 25. As a result, the signal readout circuit 20 reads the transferred signal A of the (n+1)-th row from the settled vertical output line 21b. The differential amplifier 25 performs signal amplification, and outputs the result to the AD conversion circuit 28. The AD conversion circuit 28 converts the signal input from the differential amplifier 25 into a digital signal and outputs it to the outside of the image sensor 1 (operation D(n+1)). Further, in the same period t7, the transfer pulse φTXB(n) becomes "H", and the charge accumulated in the PDs 11b in the n-th row is transferred to the FDs 13 in addition to the charge of the PDs 11a in the n-th row transferred in the period t3. As a result, the FDs 13 hold the transferred signal A+B. Thereafter, the transfer pulse φTXB(n) becomes "L", and each of the unit pixels 10 in the n-th row outputs the transferred signal A+B to the vertical output line 21a. The transferred signal A+B is reflected on the vertical output line 21a over the settling time (operation E(n)).

In a period t8, the vertical output line switching pulse φSELCb becomes "L", and the clamp capacitor 24b is disconnected from the differential amplifier 25. Further, the clamp pulse φC0R becomes "H" and the input terminal and the output terminal of the differential amplifier 25 are reset to the reference voltage VC0R.

In a period t9, the clamp pulse φC0R becomes "L" and the vertical output line switching pulse φSELCa becomes "H", and the clamp capacitor 24a is connected to the differential amplifier 25. As a result, the signal readout circuit 20 reads the transferred signal A+B of the n-th row from the settled vertical output line 21a. The differential amplifier 25 performs signal amplification, and outputs the result to the AD conversion circuit 28. The AD conversion circuit 28 convert the signal input from the differential amplifier 25 into a digital signal and outputs it to the outside of the image sensor 1 (operation F(n)). Further, in the same period t9, the transfer pulse φTXB(n+1) becomes "H", and the charge accumulated in the PDs 11b in the (n+1)-th row is transferred to the FDs 13 in addition to the charge of the PDs 11a in the (n+1)-th row transferred in the period t4. As a result, the FDs 13 hold the transferred signal A+B. Thereafter, the transfer pulse φTXB(n+1) becomes "L", and each of the unit pixels 10 in the (n+1)-th row outputs the transferred signal A+B to the vertical output line 21b. The transferred signal A+B is reflected on the vertical output line 21b over the settling time (operation B(n+1)).

In a period t10, the row selection pulse φSELR(n) becomes "L", and the unit pixels 10 in the n-th row is disconnected from the vertical output line 21a. Further, the vertical output line switching pulse φSELCa becomes "L", and the clamp capacitor 24a is disconnected from the differential amplifier 25. Furthermore, the clamp pulse φC0R becomes "H" and the input terminal and the output terminal of the differential amplifier 25 are reset to the reference voltage VC0R.

In a period t11, the clamp pulse φC0R becomes "L" and the vertical output line switching pulse φSELCb becomes "H", and the clamp capacitor 24b is connected to the differential amplifier 25. As a result, the signal readout circuit 20 reads the transferred signal A+B of the (n+1)-th row from the settled vertical output line 21b. The differential amplifier 25 performs signal amplification, and outputs the result to the AD conversion circuit 28. The AD conversion circuit 28 converts the signal input from the differential amplifier 25 into digital signal and outputs it to the outside of the image sensor 1 (operation F(n+1)). Although it is not shown, in the same period t11, the row selection pulse φSELR(n+2) becomes "H", and each of the unit pixels 10 in the (n+2)-th row starts to output a signal to the vertical output line 21a. At the same time, the reset pulse φRES(n+2) becomes "H" to eliminate the unnecessary charge of the FDs 13, and it becomes "L" after resetting the potential of the FDs 13. At this time, each of the unit pixels 10 in the (n+2)-th row outputs a reset signal to the vertical output line 21a. The reset signal is reflected on the vertical output line 21a over the settling time (operation A(n+2)). Thereafter, by repeating the same operation as from the period t2, the signals of the unit pixels 10 are sequentially read out.

According to the first embodiment as described above, each of the signal readout circuits 20 has a configuration that selects and connects one of a plurality of the vertical output lines 21, and the signal readout operation from one of the vertical output lines 21 and the signal output operation to another vertical output lines 21 are performed in parallel between adjacent columns.

In the conventional technique, the operations A to F are repeated sequentially for each row without performing operations in parallel between the adjacent rows. Here, let periods required for reading signals of two rows with the operations according to the first embodiment and with the operations of the conventional technique be compared. With the operations of the conventional technique, a period for performing the operations A to F for the n-th row and the (n+1)-th row, namely, a period for performing 12 processes, is needed. By contrast, with the operations of the first embodiment, a period for performing the operations A to F for the n-th row and the operation F for the (n+1)-th row, namely, a period for performing the total of 7 operations, is needed. Consequently, it is possible to increase the speed by a period corresponding to 5 operations. Assuming that the operations A to F respectively take the same period, reading can be completed in about 58% of a period of the operations performed using the conventional technique.

<Second Embodiment>

Next, a second embodiment of the present invention will be described. In the above-described first embodiment, the readout operation for reading out the A image and the A+B image from all the unit pixels 10 of the pixel array 100 at high speed has been described. Hereinafter, the readout operation described in the first embodiment is referred to as a first readout operation, and a mode for reading out the A image and the A+B image from all the unit pixels 10 by the first readout operation is called a first mode. Effects of the technique of the present invention are exerted in terms of image quality not only in the case of reading out the A image and the A+B image from all the unit pixels 10 but also in the case of reading out the A image and the A+B image only from some rows of the pixel array 100 and reading out the A+B image from the other rows. In the second embodiment, an operation method in which the A image and the A+B image are read out by the first readout operation only from a part of the rows of the pixel array 100 and the A+B image is read out from the other rows (hereinafter referred to as a second mode) will be described.

In the second embodiment, the control by the readout control circuit 30 is different, from that in the above-described first embodiment, and the configuration of the image sensor 1 is the same as that described with reference to FIGS. 1 to 3, and therefore, the explanation thereof is omitted. Further, since the operations A to F in the following description are also the same as the operations A to F described in the first embodiment, the description of each operation will be omitted.

In the second embodiment, in addition to the operations A to F, the operations G and H are executed. Operations G and H will be described below.

Figure 6:
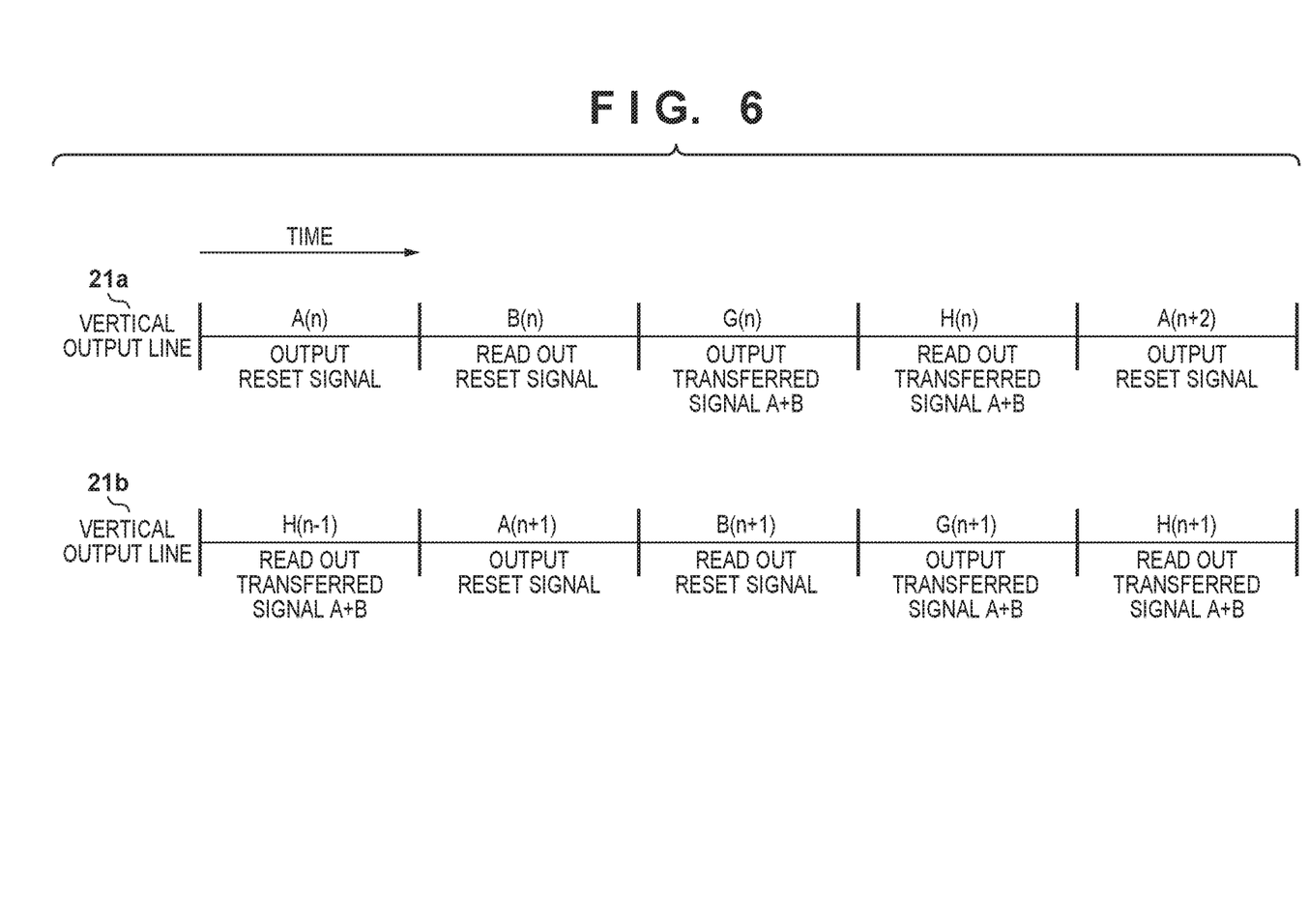
FIG. 6 is a diagram for explaining an outline of a signal readout operation according to a second embodiment.

Operation G: The readout control circuit 30 turns on the transfer switches 12a and 12b of the unit pixel 10 to hold a transferred signal A+B from the PD 11a and the PD 11b in the FD 13. Then the signal output operation is performed to output the transferred A+B held in the FD 13 to either of the vertical output lines 21a and 21b to which the unit pixel 10 is connected, then waited to settle.

Operation H. The readout control circuit 30 causes the signal readout circuit 20 to execute a signal readout operation, wherein the signal readout operation is to read out the transferred signal A+B output to one of the vertical output lines 21a and 21b via the signal readout circuit 20.

FIG. 6 is a diagram schematically showing a flow of a signal output operation when reading out only the transferred signal A+B. The difference from the readout operation in the first embodiment explained with reference to FIG. 4 will be described below.

In the first embodiment, output and readout of the reset signal are performed in the operations A and B, output and readout of a transferred signal A in the are performed in the operations C and D, and output and readout of a transferred signal A+B are performed in operations H and F. On the other hand, in the second embodiment, a transferred signal A for focus detection is not read out and a transfer signal A+B is output in the operation G after readout of the reset signal is completed in the operation B.

That is, after outputting and reading out the reset signal in the operations A and B, the readout control circuit 30 controls to perform the operation. G(n) for the n-th row and the operation B(n+1) for the (n+1)-th row.

Next, the operation H(n) is performed for the n-th row and the operation G(n+1) is executed for the (n+1)-th row.

When the operation H(n) is ended for the n-th row, next, the operation A(n+2) is executed for the (n+2)-th row and the operation H(n+1) is executed for the (n+1)-th row. Thereafter, signals are read out from all the unit pixels 10 of the pixel array 100 in a similar manner. By the above-described operation, an A+B image can be obtained.

As described above, it is possible to execute the operations A and G that includes signals in the vertical output line 21a or 21b settling in parallel with the operations B and H using the signal readout circuit 20, therefore, it is possible to increase the readout speed. Hereinafter, the readout operation described with reference to FIG. 6 is referred to as a second readout operation.

Figure 7:
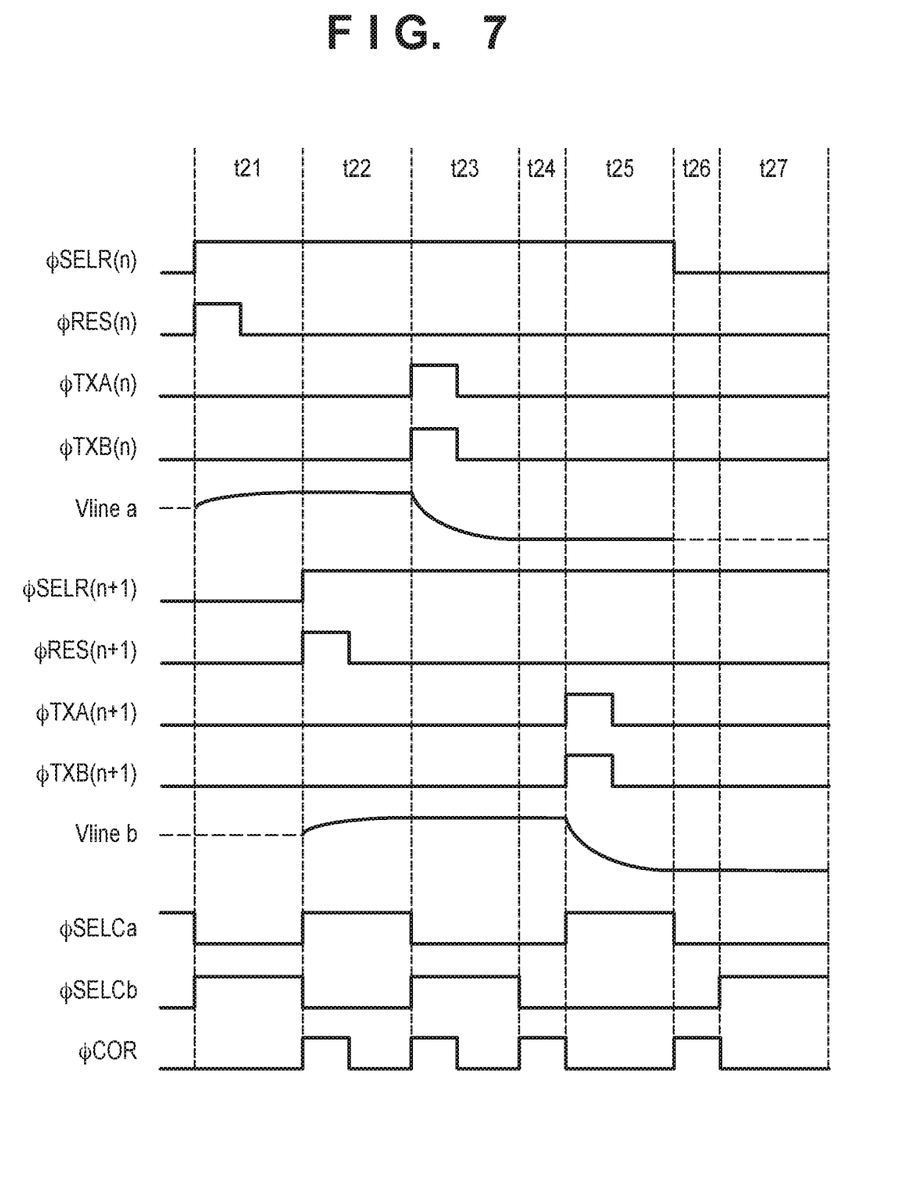
FIG. 7 is a timing chart showing the signal readout operation according to the second embodiment.

Next, a specific procedure of the second readout operation will be described. FIG. 7 is a timing chart showing the signal output operation and the signal readout operation performed by the readout control circuit 30 in the second embodiment. Here, only the portion different from the operation described with reference to FIG. 5 in the first embodiment will be described.

Operations in a period t21 and a period t22 are the same as those in the period t1 and the period t2. In a period t23, the vertical output line switching pulse φSELCa becomes "L" and the vertical output line switching pulse φSELCb becomes "H", so that the clamp capacitor 24a is disconnected from the differential amplifier 25, and the clamp capacitor 24b is connected instead. At this time, the signal readout circuit 20 reads out the reset signal from the vertical output line 21b. The clamp pulse φC0R is "H", and the input terminal and the output terminal of the differential amplifier 25 are reset to the reference voltage VC0R. Thereafter, when the clamp pulse φC0R becomes "L", the clamp capacitor 24b clamps (holds) the reset signal of the (n+1)-th row to the reference voltage VC0R (operation B(n+1)).

Further, in the same period t23, the transfer pulses φTXA (n) and φTXB(n) simultaneously becomes "H", and charge accumulated in the PDs 11a and PDs 11b in the n-th row are simultaneously transferred to the FDs 13. Thereafter, the transfer pulses φTXA(n) and φTXB(n) simultaneously becomes "L", and each of the unit pixels 10 in the n-th row outputs the transferred signal A+B to the vertical output line 21a. The transferred signal A+B is reflected on the vertical output line 21a over the settling time (operation G(n)).

The operation in the period t24 is same as that in the period t4.

Then, in the period t25, the clamp pulse φC0R becomes "L" and the vertical output line switching pulse φSELCa becomes "H", so that the clamp capacitor 24a is connected to the differential amplifier 25. By this operation, the signal readout circuit 20 reads out the transferred signal A+B of the nth row from the settled vertical output line 21a. The differential amplifier 25 performs signal amplification according to the signal gain determined by the capacitance ratio of the clamp capacitor 24 and the gain capacitor 26, and outputs the result to the AD conversion circuit 28. Strictly speaking, since the reset signal is clamped to the reference voltage VC0R by the clamp capacitor 24, the difference between the reset signal and the transferred signal A+B is amplified. The AD conversion circuit 28 converts the signal input from the differential amplifier 25 into a digital signal and outputs it to the outside of the image sensor 1 (operation H(n)).

Further, in the same period t25, the transfer pulse φTXA (n+1) and the transfer pulse φTXB(n+1) simultaneously become "H", and the charge accumulated in the PDs 11a and PDs 11b in the (n+1)-th row is simultaneously transferred to the FDs 13. Thereafter, the transfer pulse φTXA(n+1) and the transfer pulse φTXB(n+1) becomes "L", and each of the unit pixels 10 in the (n+1)-th row outputs the transferred signal A+B to the vertical output line 21b. The transferred signal A+B is reflected on the vertical output line 21b over the settling time (operation G(n+1)).

The operations in the periods t26 and t27 are same as those the period t10 and t11.

In the conventional technique, the operations A, B, G and H are repeated sequentially for each row without performing operations in parallel between the adjacent rows. Here, let periods required for reading signals of two rows with the operations according to the second embodiment and with the operations of the conventional technique be compared. With the operations of the conventional technique, a period for performing the operations A, B, G and H for the n-th row and the (n+1)-th row, namely, a period for performing 8 processes, is needed. By contrast, with the operations of the second embodiment, a period for performing the operations A, B, G and H for the n-th row and the operation H for the (n+1)-th row, namely, a period for performing the total of 5 operations, is needed. Consequently, it is possible to increase the speed by a period corresponding to 3 operations. Assuming that the operations A, B, G and H respectively take the same period, reading can be completed in about 63% of a period of the operations performed using the conventional technique.

Next, with reference to FIG. 8, the second mode of reading out the A image and the A+B image from a part of rows of the pixel array 100, and reading out the A+B image from the other rows will be explained.

Figure 8:
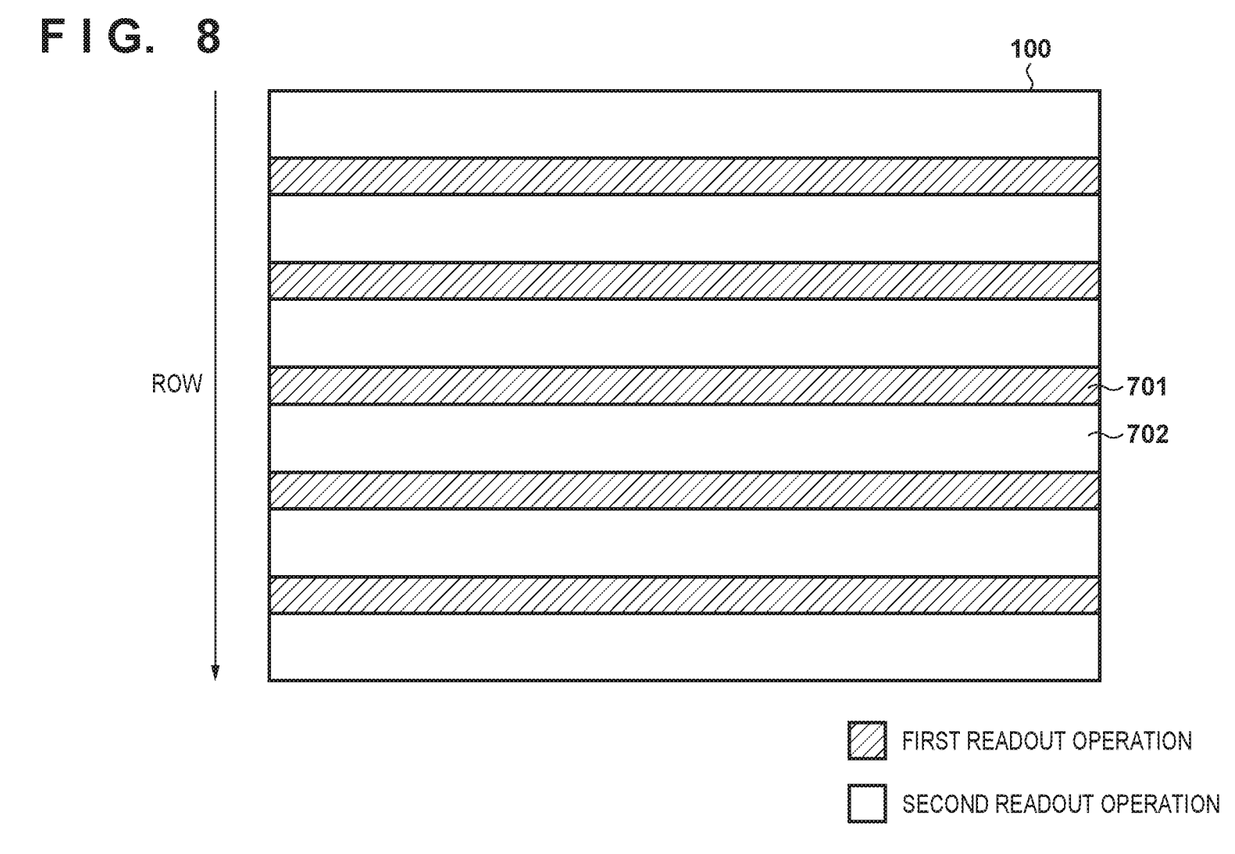
FIG. 8 is a diagram for explaining readout control in a second mode according to the second embodiment.

FIG. 8 shows an example of readout control in the second mode. In pixel array 100, an area 701, indicated as the hatched portion is read by the first readout operation and the area 702 indicated as the white portion is read by the second readout operation.

By performing the first readout operation that takes a longer readout period than the second readout operation for a part of rows, it is possible to further reduce a readout period for reading out signals from one frame.

On the other hand, in the case of performing operation in which the readout time is different for each region, if a subject moving at high speed is captured with a rolling shutter in addition to the conventionally known rolling distortion phenomenon, another distortion between regions caused by different readout periods (referred to as "second rolling distortion phenomenon", hereinafter) occurs.

Here the effect of speed up by the first readout operation and the second readout operation with respect to the conventional drive will be compared. Assuming that the operations A to H are executed in the same period respectively, in the conventional driving method, 12 operations are needed for reading out the transferred signal A for the A image and the transferred signal A+B for the A+B image from two rows. By contrast, in the first readout operation, reading can be completed in about 58% of a perod of the operations performed using the conventional technique. Further, in the conventional driving method, 8 operations are needed for reading out the transferred signal A+B for the A+B image from two rows. By contrast, in the second readout operation, reading can be completed in about 63% of a period of the operations performed using the conventional technique. That is, the effect of speeding up is greater in the first readout operation than in the second readout operation. This is because the time for operating in parallel is longer in the first readout operation because the signal for focus detection needs to be read out.

This means that the difference between the readout periods in the first readout operation and in the second readout operation is reduced, and the second rolling distortion phenomenon can be reduced.

In addition, the second mode may be used only in the case of shooting conditions in which rolling distortion phenomenon and second rolling distortion phenomenon do not occur (for example, shooting operation using a mechanical shutter). Then, operation method may be switched according to image shooting conditions such as driving in first mode when performing rolling drive for moving images and the like.

For the sake of simplicity, the above-described effects of the speeding up are explained in a case where each operation is performed in the same period, however, the period of each actual operation is appropriately determined according to the design of the image sensor. However, even when the period of each operation is appropriately determined according to the design, it is still possible to perform operations in parallel, and the effects of the speeding up can be sufficiently expected.

In addition, if the difference in the readout period with respect to the first readout operation can be reduced by using the conventional readout operation which requires 8 operations for reading only the transferred signals A+B from two rows by setting the appropriate operation period, the readout operation for reading only the transferred signal A+B may be performed using the conventional readout operation. By operating in this way, the time required for readout becomes longer as compared with the case of performing the second readout operation, but the second rolling distortion phenomenon can be reduced.

<Third Embodiment>

Figure 9:
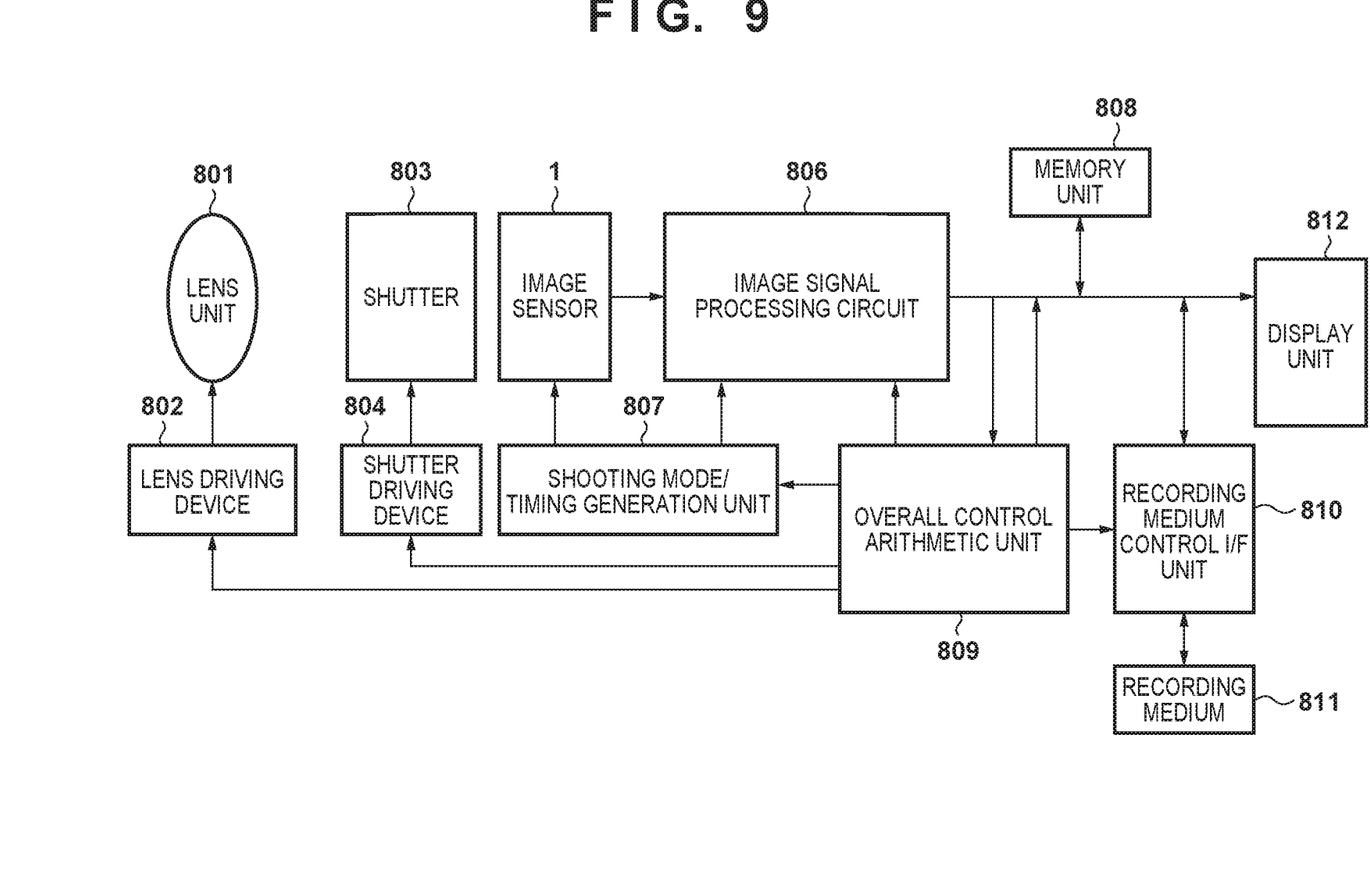
FIG. 9 is a block diagram showing a schematic configuration of an image capturing apparatus according to a third embodiment.

Next, a third embodiment of the present invention will be described. In the third embodiment, an example of an image capturing apparatus equipped with the image sensor 1 described in the first or second embodiment will be described with reference to FIG. 9. FIG. 9 is a block diagram showing a schematic configuration of the image capturing apparatus according to the third embodiment.

In FIG. 9, a lens unit 801 forms an optical image of a subject on the image sensor 1. Further, zoom control, focus control, aperture control and so forth are performed by a lens driving device 802.

A mechanical shutter 803 controls exposure and light shielding of the image sensor 1, and is controlled by a shutter driving device 804. An image signal processing circuit 806 performs various corrections and data compression, calculation for focus detection, and so forth, on the image signal and focus detection signal output from the image sensor 1. A shooting mode/timing generation unit 807 outputs various timing signals, such as a switching signal for switching between the first mode and the second mode or a signal for performing the first readout operation and the second readout operation, to the image sensor 1 and the image signal processing circuit 806.

A memory unit 808 functions as a memory for temporarily storing image data, and an overall control arithmetic unit 809 is a circuit that performs various arithmetic operations and control of the entire image capturing apparatus. A recording medium control I/F unit 810 is an interface for recording or reading on a recording medium, a recording medium 811 is a removable semiconductor memory for recording or reading out image data, and a display unit 812 is a device for displaying various information and captured images.

Next, the operation of the image capturing apparatus having the above-described configuration at the time of photographing will be described. When the main power supply is turned on, the power supply to the control system is turned on, and then the power supply to a circuit of the image pickup system such as the image signal processing circuit 806 is turned on. Thereafter, when a release button (not shown) is pressed, an image shooting operation is started.

Upon completion of the image shooting operation, the image signal output from the image sensor 1 is subjected to image processing by the image signal processing circuit 806, and written into the memory unit 808 according to an instruction from the overall control arithmetic unit 809. The data written in the memory unit 808 is recorded on the removable recording medium 811 such as a semiconductor memory through the recording medium control I/F unit 810 under the control of the overall control arithmetic unit 809. Further, the image may be processed by inputting directly to a computer or the like through an external I/F unit (not shown).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-030247, filed on Feb. 21, 2017 which is hereby incorporated by reference herein in its entirety.

What is claimed is:

1. An image sensor comprising:
a pixel array having a plurality of unit pixels each including a plurality of photoelectric conversion portions and each of a plurality of microlenses arranged in a matrix;
a plurality of signal output lines provided for each column of the pixel array and connected to the unit pixels so that each of the unit pixels arranged in each column is connected to any of the plurality output lines;
signal readout circuits each provided for each column of the pixel array; and
a control circuit that controls to output a signal of a selected row to one of the plurality of signal output lines and controls to process the signal by the corresponding signal readout circuit,
wherein the control circuit performs control such that while a signal of a first row output to one of the plurality of signal output lines is processed by the corresponding signal readout circuit, a signal from a second row, different from the first row, is output to another of the plurality of signal output lines,
each unit pixel outputs a reset signal and a first transferred signal that is, based on charge corresponding to incident light and transferred from a part of the plurality of photoelectric conversion portions, and
the control circuit controls
first control of outputting the reset signal to the signal output line connected to the unit pixel,
second control of processing the reset signal output to the signal output line in the first control by the signal readout circuit,
third control of outputting the first transferred signal to the signal output line, and
the fourth control of processing the first transferred signal output to the signal output line in the third control by the signal readout circuit, and
the, control circuit controls a first readout operation in which the second control for the first row and the first control for the second row are performed in parallel, the third control for the first row and the second control for the second row are performed in parallel, the forth control for the first row and the third control for the second row are performed in parallel.

2. The image sensor according to claim 1, wherein each of the signal readout circuits has a plurality of capacitors, provided for the plurality of signal output lines, respectively, for holding signals output to the plurality of signal output lines, and
each of the signal readout circuits holds the signal of the second row in a second capacitor provided for one of the signal output lines While processing the signal of the first row stored in a first capacitor provided for the other of the signal output lines.

3. The image sensor according to claim 1, wherein each unit pixel further outputs a second transferred signal that is based on charge corresponding to the incident light and transferred from all of the plurality of photoelectric conversion portions, and
the control circuit further controls
fifth control of outputting the second transferred signal to the signal output line connected to the unit pixel, and
sixth control of processing the second transferred signal output to the signal output line in the fifth control by the signal readout circuit, and
controls the fifth control for the first row and the fourth control of the second row are performed in parallel, and the sixth control for the first row and the fifth control for the second row are performed in parallel.

4. The image sensor according to claim 3, wherein the control circuit controls a second readout operation in which the second control for the first row and the first control for the second row are performed in parallel, the fifth control for the first row and the second control for the second row are performed in parallel, and the sixth control for the first row and the fifth control for the second row are performed in parallel.

5. The image sensor according to claim 4, wherein the control circuit performs the first readout operation for all of the unit pixels in the pixel array in a first mode, and in a second mode performs the first readout operation for a predetermined part of the rows of the pixel array and performs the second readout operation for the rows except for the predetermined part of the rows.

6. The image sensor according to claim 5, wherein the control circuit performs control in the first mode in a case of image shooting condition in which a rolling distortion phenomenon occurs, and performs control in the second mode in a case of image shooting condition in which the rolling distortion phenomenon does not occur.

7. The image sensor according to claim 3, Wherein the control circuit controls a second readout operation in which, after performing the first, second, fifth and sixth controls for the first row, the first, second, fifth and sixth controls for the second row are performed, and
the control circuit performs the first readout operation for all the unit pixels of the pixel array in a first mode, and in a second mode performs the first readout operation for a predetermined part of the rows of the pixel array and performs the second readout operation for the rows except for the predetermined part of the rows.

8. An image capturing apparatus including:
an image sensor comprising:
a pixel array having a plurality of unit pixels each including a plurality of photoelectric conversion portions and each of a plurality of microlenses arranged in matrix;
a plurality of signal output lines provided for each column of the pixel array and connected to the unit pixels so that each of the unit pixels arrange in each column is connected to any of the plurality of signal output lines;
signal readout circuits each provided for each column of the pixel array; and
a control circuit that controls to output a signal of a selected row to one of the plurality of signal output lines and controls to process the signal by the corresponding signal readout circuit, and
a processor that processes a signal output from the image sensor,
wherein the control circuit performs control such that while a signal of a first row output to one of the plurality of signal output lines is processed by the corresponding signal readout circuit, a signal from a second row, different from the first row, is output to another of the plurality of signal output lines,
each unit outputs a reset signal and a transferred signal that is based on charge corresponding to incident light and transferred from a part of the plurality of photoelectric conversion portion, and the control circuit controls
first control of outputting the reset signal to the signal output line connected to the unit pixel,
second control of processing the reset signal output to the signal output line in the first control by the signal readout circuit,
third control of outputting the transferred signal to the signal output line, and
the fourth control of processing the transferred signal output to the signal output line in the third control the signal readout circuit, and the control circuit controls a first readout Operation in which the second control for the first row and the first control for the second row are performed in parallel, the third control for the first row and the second control for the second row are performed in parallel; the forth control for the first row and the third control for the second row are performed in parallel.

9. A control method of an image sensor that has a pixel array having a plurality of unit pixels each including a plurality of photoelectric conversion portions and each of a plurality of microlenses arranged in matrix, a plurality of signal output lines provided for each column of the pixel array and connected to the unit ,pixels so that each of the unit pixels arranged in each column is connected to any of the plurality of signal output lines, and signal readout circuits each provided for each column of the pixel array, wherein, each unit pixel outputs a reset signal and a transferred signal that is based on charge corresponding to incident light and transferred from a part of the plurality of photoelectric conversion portions, the method comprising:

processing, while outputting reset signals from the unit pixels in a second row to second signal output lines of the plurality of signal output lines, reset signals output from the unit pixels in a first row to first signal output lines of the plurality of signal output lines by the corresponding signal readout circuit;

outputting, while processing the reset signals output from the unit pixels in the second row to the second signal output lines by the corresponding signal readout circuit, transferred signals from the unit pixels in the first row the first signal output lines, and processing while outputting transferred signals from the unit pixels in the second row to the second signal output lines, the transferred signals output from the unit pixels in the first row to the first signal output lines by the corresponding signal readout circuit.

* * * * *